United States Patent [19]

Dinger et al.

[11] Patent Number: 4,537,515
[45] Date of Patent: Aug. 27, 1985

[54] RESONATOR TEMPERATURE COMPENSATED TIME BASE AND WATCH USING SAID TIME BASE

[75] Inventors: Rudolf Dinger, St-Aubin; Jean-Georges Michel, Neuchâtel; Claude-Eric Leuenberger, Chézard, all of Switzerland

[73] Assignee: Asulab S.A., Bienne, Switzerland

[21] Appl. No.: 447,457

[22] Filed: Dec. 6, 1982

[30] Foreign Application Priority Data

Dec. 17, 1981 [CH] Switzerland .................. 8060/81

[51] Int. Cl.³ .................................. G04B 17/20
[52] U.S. Cl. ........................ 368/202; 368/11; 368/200; 331/66; 331/70
[58] Field of Search ............... 368/202, 200, 11; 331/65, 66, 70

[56] References Cited

U.S. PATENT DOCUMENTS 4,298,971 11/1981 Morokawa et al. ............... 368/204
4,325,036 4/1982 Kuwabara ......................... 368/202
4,437,773 3/1984 Dinger et al. ...................... 310/361

FOREIGN PATENT DOCUMENTS 042056 3/1980 Japan .............................. 368/202
146090 11/1980 Japan .............................. 368/202

Primary Examiner—Bernard Roskoski
Attorney, Agent, or Firm—Spensley Horn Jubas & Lubitz

[57] ABSTRACT

To compensate for frequency variation in the quartz oscillator 4, 6 due to temperature variation, a second quartz oscillator 12, 14 forming a thermal sensor is employed. The beat frequency fB (circuit 16) which is counted in the counter 26 for a period of time $T_1$ gives a measurement corresponding to temperature. The number which is thus counted is raised to its square and by means of the comparator 30 taken away from the pulses counted by the divider 8 with a periodicity $T_T$. The system may be used to provide temperature compensation for a time keeping quartz time base.

6 Claims, 18 Drawing Figures

Fig.5b   $2(f-f_S)=f_F$

RESONATOR TEMPERATURE COMPENSATED TIME BASE AND WATCH USING SAID TIME BASE

BACKGROUND OF THE INVENTION

The present invention concerns a temperature compensated time base, and a watch incorporating the time base. More precisely the time base is of the type in which compensation for the effect of temperature on the frequency produced by the time base is effected by using two piezoelectric resonators to form said time base, usually quartz resonators.

It is well known that present-day electronic watches are very accurate. However, in such watches, the time base is formed by an oscillator including a quartz resonator. The frequency of the oscillator, which is generally of the order of 32 kHz, is temperature dependent. In consequence, the resonator has a very precise frequency for a given temperature but when the temperature changes the frequency of the resonator also changes. For example, in the case of a quartz time base in which the resonator gives the reference frequency at a temperature of 25° C., over a range from 0° to 50° C., the operating error may be up to 20 ppm or more.

It is therefore a particularly attractive proposition to compensate for the effect of temperature on the time base frequency, in order to produce more accurate watches. To that end three main systems have been used hitherto, all of which employing two quartz resonators.

FIGS. 1a to 1c illustrate the basic principles of the three systems. In FIGS. 1a and 1b, the two oscillators each comprise an independently operating quartz resonator.

The difference between these two systems results from the thermal characteristics of the two resonators. The temperature T is shown along the abscissae and the relative variations in frequency are shown as the ordinates. In the process shown in FIG. 1a, the first resonator has a characteristic I such that its inversion point $I_1$ coincides with a point on the characteristic II of the second quartz resonator. The second resonator has an inversion point $I_2$ which does not play any particular part, in itself. The temperature coefficients of the second order ($\beta$), that is to say, the coefficients of the terms in $T^2$ in the formula which gives the variations in frequency in dependence on the variation in temperature, must be strictly equal. It is therefore necessary to use two resonators which are strictly paired, in order to provide an attractive compensation effect.

In the compensation system shown in FIG. 1b, the characteristics I and II of the two resonators must have coincident inversion points $I_1$ and $I_2$, that is to say, for the two resonators, the inversion temperature and the inversion frequency must be the same. In addition, the coefficient $\beta 1$ of the first resonator must be double the coefficient $\beta 2$ of the second resonator. It will be readily seen that in this case also it is necessary for the two resonators to be very carefully matched.

In the compensation mode illustrated in FIG. 1c, the two resonators are mounted in parallel in the same oscillator. In order to achieve good compensation in a given operating temperature range, the temperature and the frequency of the inversion points $I_1$ and $I_2$ of the characteristics I and II of the two resonators must be known perfectly. The two quartz resonators therefore also have to be matched, with a high degree of accuracy.

It will be seen from the foregoing consideration of the state of the art that, in all cases, it is only possible to produce an acceptable compensation effect, if two quartz resonators having thermal characteristics which actually comply with the conditions required are used in the same watch. It will be readily appreciated that selecting the two resonators results in a very substantial increase in the cost of the time base, because of the necessity for matching the two quartz resonators.

SUMMARY OF THE INVENTION

The main object of the present invention is to overcome that disadvantage, while providing very good thermal compensation in a given temperature range, without the necessity to carry out strict matching of the two quartz resonators which are to be used in the time base.

An other object of the invention is to provide a time base circuit provided with two resonators, which has electronic circuits that do not substantially increase the consumption of electrical power or the area of silicon required for integration of those circuits, in comparison with the conventional oscillators.

To attain those aims, the present invention uses, in the time base, a first frequency generator of conventional type comprising an oscillator provided with a piezoelectric resonator producing a first frequency, for example of 32 kHz, the frequency variations of which depend on the variation in temperature in the temperature range under consideration; and a second frequency generator provided with an oscillator including a second piezoelectric resonator forming a temperature sensor. The second resonator, of quartz type, for example, produces a second signal at a second frequency which is substantially linearly dependent on temperature in the temperature range in question. Its coefficient of temperature dependency is preferably much higher than that of the first resonator.

The frequency difference between the two resonators is substantially proportional to the temperature of the system and therefore makes it possible to measure the temperature and then correct the variation in frequency of the first resonator. In the particular but frequent situation where the first resonator has a substantially quadratic relationship between the relative variation in frequency and the variation in temperature, a particularly suitable solution is as follows:

A beat signal is produced, as between the first and second signals produced by the two quartz resonators, and a signal is produced, comprising a number of pulses $N_1$ which is equal to the number of pulses of the beat signal for a given period of time $T_1$. A second correction signal which is representative of the square of the number of pulses $N_1$ is produced. That gives a signal having $N_2$ pulses, representative of the square of the difference in temperature with respect to the reference temperature of the first oscillator, bearing in mind that the frequency of the first oscillator is relatively independent of temperature. Then, in response to that signal comprising the $N_2$ pulses, the frequency of the signal supplied by the first oscillator is adjusted.

Either that adjustment comprises acting on the oscillating circuit of the resonator, for example, adjusting the value of a trimmer in the oscillating circuit, or the adjustment comprises acting on a divider associated with the first oscillator which normally counts for example 32768 pulses supplied by the first oscillator to produce each period of a second of the time signal. That action comprises suppressing $N_2$ of the 32768 pulses, or adding $N_2$ to the 32768 pulses every $T_T$ seconds, to produce an adjusted period of the time signal. Therefore, every $T_T$ seconds, a period of 'one second' is shortened, or lengthened.

The invention also concerns a watch using a time base provided with a quartz resonator acting as a temperature sensor which also permits display of the ambient temperature.

BRIEF DESCRIPTION OF THE DRAWINGS

Other features and advantages of the invention will be better appreciated from the following description of a number of embodiments of the invention which are given by way of example, with reference to the accompanying drawings, in which:

FIG. 4b is a time diagram showing the mode of operation of the circuit of FIG. 4a;

FIG. 4c is a simplified circuit diagram of the control circuit of the arrangement shown in FIG. 4a;

FIG. 5b is a time diagram illustrating the mode of operation of the generator shown in FIG. 5a;

FIG. 6b is a time diagram illustrating the mode of operation of the circuit shown in FIG. 6a;

DETAILED DESCRIPTION OF THE PREFERRED EMBODIMENTS

The description set out below is more particularly concerned with the case where the time base is used in an electronic watch of digital or analog type. It will be immediately apparent to the man skilled in the art however that the thermal compensation system used could be perfectly well adapted to other time bases such as those which can be used in connection with microprocessors or in computers. In fact, as will be shown hereinafter, the compensation effect is in no way critically dependent on the reference frequency supplied by the quartz oscillator which is to be stabilized in respect of temperature.

Figure 1A:
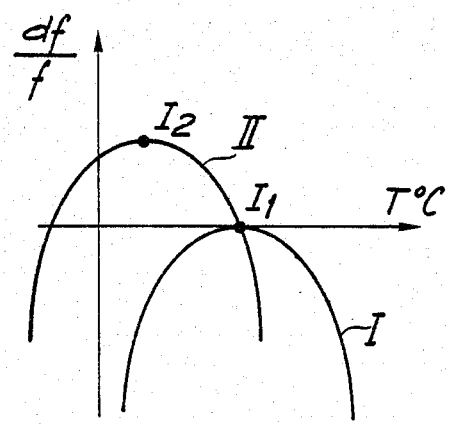
FIGS. 1a to 1c, which have already been described above, illustrate three known processes for providing thermal compensation for a quartz oscillator, these drawings showing the thermal characteristics of the two quartz resonators used with the temperature T shown in the abscissae and the relative variation in frequency of the resonators shown in the ordinates.
Figure 1B:
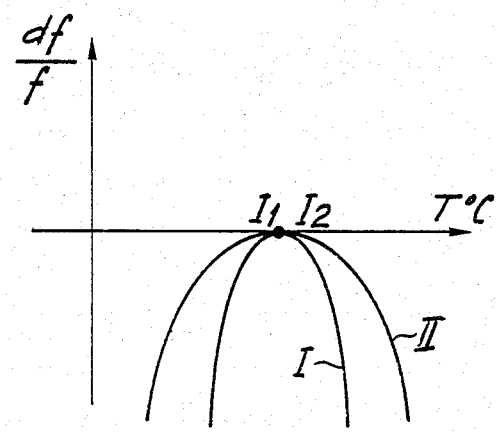
Figure 1C:
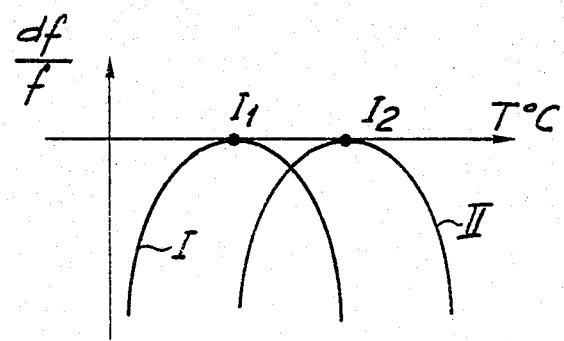
Figure 3:
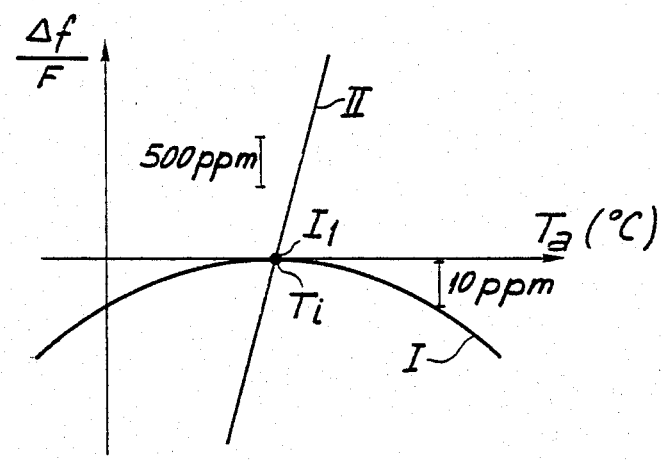
FIG. 3 is a diagram illustrating the thermal characteristics of the time-keeping quartz and the temperature sensor used in the circuit shown in FIG. 2, again plotting the relative variation in frequency of the resonators against temperature.
Figure 2:
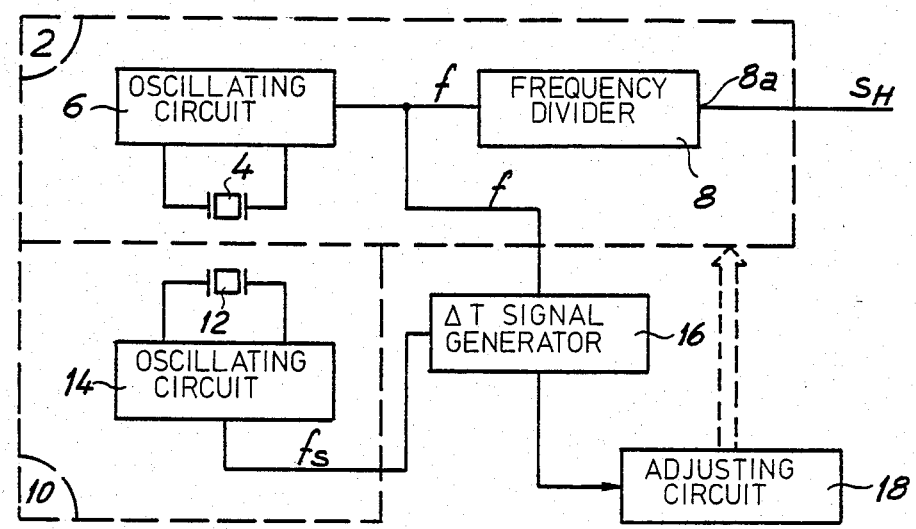
FIG. 2 is a simplified diagram showing a complete time base provided with its thermal compensation means according to the invention.

As can be seen from FIG. 2, the time base first comprises a first frequency generator 2 conventionally comprising an oscillator formed by a quartz resonator 4 associated with an oscillating circuit 6 which at its output produces a periodic signal at frequency f, and a frequency divider 8 which receives at its input the signal at frequency f, to produce a time signal $S_H$ with a period of one second. By way of example, the quartz resonator 4 is a resonator of tuning fork type which produces a signal at a normal frequency of 32768 Hz, as is conventional practice in time bases for electronic watches. In FIG. 3, the curve I represents the typical thermal characteristic of such a quartz resonator. The ordinates show the relative variation in frequency while the abscissae show the temperature in degrees Celsius. The characteristic I is in the shape of a quadratic curve, the apex $I_1$ of which forms the inversion point. The inversion temperature $T_i$ which is for example 25° Celsius, and the base frequency f of the resonator, which is for example 32768 Hz, correspond to point $I_1$.

More precisely, the frequency f of the quartz, in dependence on the temperature difference T between ambient temperature $T_a$ and the inversion $T_i$ is given by the following relationship:

$$f(T) = f_o(1 + \alpha_o T + \beta_o T^2 + \gamma_o T^3 + \ldots) \quad (1)$$

in which $f_o$, $\alpha_o$, $\beta_o$ and $\gamma_o$ are constants. These are completely conventional characteristics of a time-keeping quartz resonator. In the case envisaged, the divider 8 comprises a certain number of binary division stages, the output $8_a$ of the last stage producing te periodic time signal $S_H$ with a period of one second.

The second frequency generator 10 comprises a quartz resonator 12 and an oscillating circuit 14. The frequency generator produces a periodic signal at a frequency of $f_S$. In actual fact, the resonator 12 is a temperature sensor which has quite particular characteristics. As can be seen from FIG. 3, its characteristic II in respect of variation in frequency in dependence on temperature is substantially a straight line, at least in the temperature range envisaged, and the rate of dependency with respect to temperature is very high. In addition, the characteristic II passes through the inversion point $I_1$ of the characteristic I of the time keeping resonator. In FIG. 3, the scales to represent the ordinates (ppm) are different, to make it easier to read the drawing. The two numerical values which are included therein make it possible more easily to appreciate the real laws governing the relative variation in frequency in dependence on temperature. The resonator 12 has a frequency characteristic in dependence on temperature, which is given by the following general formula:

$$f_S(T) = f'_o(1 + \alpha_S T + \beta_S T^2).$$

In the above formula, $\alpha_S$ is larger than $\beta_S$ by several orders of magnitude, and $\beta_o$ is several orders of magnitude smaller than $\beta_S$. As a first approximation therefore, it can be considered that $f_S$ is in the temperature range which is considered, a straight line. In addition, at the inversion temperature, the frequency of that resonator is a whole multiple of the normal frequency of the resonator 4. In the particular case envisaged, that ratio is 8. Preferably, the values of the coefficients $\alpha_S$ and $\beta_S$ are as follows:

$\alpha_S = 34$ ppm/°C.

$\beta_S = 20 \cdot 10^{-3}$ ppm/°C$^2$.

A quartz resonator 12 having the above-indicated characteristics is for example a resonator of tuning fork type, which is excited in a main torsion mode. The resonator is cut in such a way that the main faces thereof are perpendicular to an axis Z' which is at an angle of about 2° to the optical axis Z of the quartz, with the arms being parallel to the axis X of the quartz. The width of an arm of the tuning fork is for example 0.230 mm, while its thickness is 0.125 mm. It will be appreciated that there are other ways of manufacturing such a temperature sensor by means of a quartz resonator. Such quartz resonators are described in European patent application No. 81.810333.5 or the co-pending U.S. patent application Ser. No. 295,777.

The signals which are respectively at a frequency f, from the time keeping oscillator 4, 6, and at a frequency $f_s$, from the sensor 14, are applied to the inputs of a circuit 16 which produces a signal representing the temperature difference T at its output. If it is considered, taking into account the respective values of $\alpha_S$ and $\beta_S$, that the thermal characteristic of the thermal sensor resonator is virtually linear in the temperature range under consideration (for example from 0° to 50° Celsius) and that, taking account of the fact that the degree of dependency of the frequency of the time keeping quartz with respect to temperature is much lower than that of the temperature-measuring quartz, the frequency of the resonator 4 is independent of temperature, it can be said, in a first approximation, that that frequency difference represents a quantity that is proportional to the temperature difference measured by the thermal sensor 14, the oscillator 4, 6 forming the reference therefor. The adjusting circuit 18 produces an adjustment signal in response to the signal which is representative of the temperature difference.

As will be explained hereinafter, the adjustment may be made either by acting on the divider 8 or by acting on the oscillating circuit 6 of the oscillator 4. It is for that reason that the arrow coming out of the circuit 18 is directed towards the whole of the frequency generator 2.

The foregoing description is already sufficient to demonstrate the main advantages of the compensation principle used in the present invention. FIG. 3 clearly shows that there is no problem in regard to matching, in the true sense, between the two resonators. In fact, the only condition that must be met is that the characteristic II of the thermal sensor passes through the inversion point $I_1$ of the characteristic 1 of the timekeeping quartz. That condition is easily met because it is easy to displace the straight line or the virtually straight line II, parallel to the ordinate axis, for example by acting on a trimmer associated with the oscillating circuit 14, or by other means which will be described in greater detail hereinafter. Moreover, it can be added that it is easy to see that, taking account of the very high level of dependency with respect to temperature of the characteristic II of the thermal sensor with respect to the same dependency of the characteristic I of the timekeeping oscillator, the fact that the characteristic II does not pass precisely through the inversion point $I_1$ will have hardly any effect on the correction made.

In addition, the compensation system actually uses a thermal sensor, without the thermal sensor suffering from the disadvantages which are normally found in such sensors. In fact, it is clear that any measuring apparatus for converting one physical parameter into another must include an absolute reference which is independent of the physical parameter to be measured. For example, when the thermal sensor produces a measuring signal in the form of an electrical voltage, it is necessary, in order to make the measurement, to have a reference voltage which is independent of temperature. Now, that gives rise to many problems. With the present invention, it is clear that it is the frequency generator 2 which acts as a reference in regard to the thermal sensor 10. On the one hand, that makes it possible to omit a component. On the other hand, taking account of the temperature sensitivity of the sensor, the frequency generator may be considered as a reference which is virtually independent of temperature. In addition, the temperature measurement which is taken in the above-described manner is presented in the form of a periodic signal, that is to say, in a quasi-digital form; now, it is known that it is that form of measuring signal which is the easiest to process.

Figure 10:
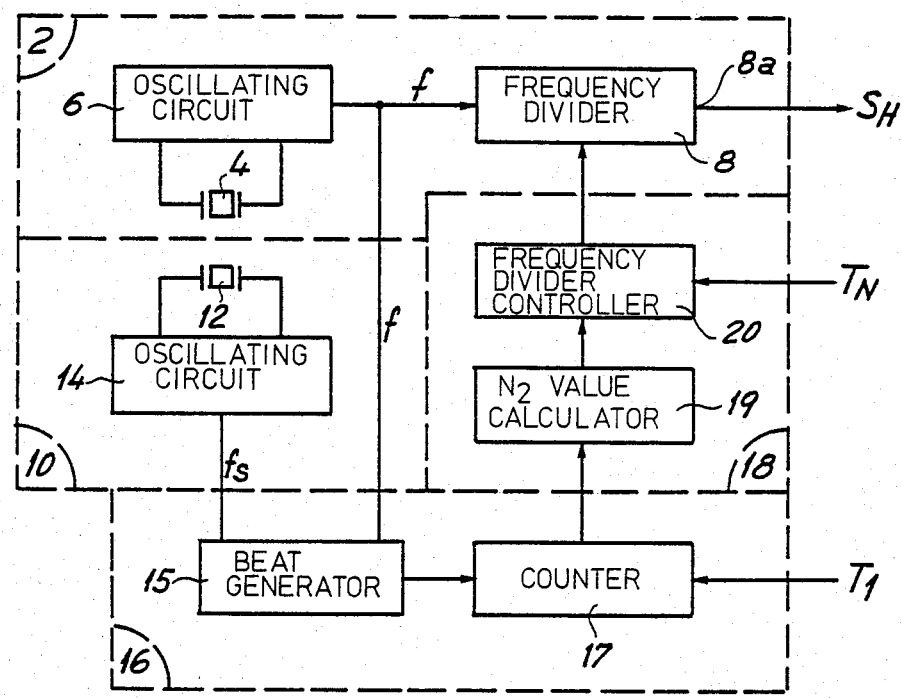
FIG. 10 shows another embodiment of the time base wherein the time keeping oscillator has a polynomial law of dependency of frequency with respect to temperature.

FIG. 10 shows in greater detail an embodiment of the time base in the broadest situation where the relationship between the relative variations in frequency of the resonator 4 in dependence on the temperature difference is any polynomial function of the above-mentioned type (relationship 1). FIG. 10 again shows the first frequency generator 2 which is identical to that shown in FIG. 2, and the second frequence generator 10 which is also identical to that shown in FIG. 2. The circuit 16 in FIG. 2 comprises a beat generator 15 and a counter 17. The beat generator receives at its inputs the signal at frequency f from the oscillator 4, 6 and the signal at frequency $f_S$ from the oscillator 12, 14. At its output, it produces a beat signal at frequency $f_B$ which therefore represents the difference between the frequencies f and $f_S$. The counter 17 counts the number of periods $N_1$ of the signal $f_B$, for a predetermined period of time $T_1$. The number $N_1$ is equal to $f_B T_1$. It is therefore proportional to the temperature difference, within the approximations referred to above. The nunber $N_1$ is introduced into a circuit 19 which calculates a corresponding correction value (in accordance with the polynomial function) to be applied to the frequency generator 2 to compensate for the effect of the temperature difference T measured by the circuit 16. In the construction shown in FIG. 10, the frequency correction or adjustment is achieved by acting on the divider 8. To produce a period of one second of the signal $S_H$, the divider 8 counts a certain number of successive pulses of the signal f which is supplied by the oscillator 4, 6. In the situation where the oscillator is operating at a frequency of 32768 Hz at its inversion temperature, the counter 8 must therefore normally count 32768 pulses to produce a period of one second. The adjustment comprises taking $N_2$ pulses from the 32768 pulses which are normally counted, to define a period of one second. This therefore results in an adjusted period which is shortened or more generally modified by ($N_2$/32768) second.

That operation is not carried out over all the periods of one second of the signal $S_H$, but only periods which are separated by a time interval of $T_N$ seconds. The period of $T_N$ seconds depends on the degree of resolution desired in respect of the frequency adjustment. The purpose of the circuit 19 is to produce the number $N_2$ in dependence on the value $N_1$ which is representative of the temperature difference and the selected adjustment period $T_N$. The circuit 20 which receives the number $N_2$ permits the number $N_2$ to be taken from the counting cycle of the divider 8 to shorten its period correspondingly. The signal with a period of $T_N$ serves to strobe those seconds within which the corrections are effected. The circuit 19 may be either a read only memory or a microprocessor. The circuit must form the relationship between the value of the number $N_1$ and the numerical value of the temperature difference; and calculate the numerical value of ($\Delta f/f$) (relationship 1) for a particular value of T as a number $N_2$ which takes account of the period $T_1$ and the period $T_N$.

If it is accepted that the circuit 19 is adapted to a single, individualised time base, the circuit 19 may be a read only memory.

In fact, if the period $T_1$ and $T_N$ are definitively fixed and if the parameters of the two particular quartz resonators used are fixed (f, $\alpha_o$, $\beta_o$, f's, $\alpha_S$, $\beta_S$), it will be appreciated that it is possible to establish an unequivocal correspondence between the value of $N_1$ and the associated value $N_2$ for the entire temperature range. The read only memory is then loaded with the table of correspondence between the values of $N_1$ forming addresses and values of $N_2$. If on the other hand the circuit 19 is to be such that it can be adapted to different time bases, the circuit 19 is a microprocessor. The microprocessor is preprogrammed to perform the three operations referred to above.

When the circuit 19 is fitted in a particular time base, the corresponding values of the parameters ($f_o$, $\alpha_o$, $\beta_o$, $\gamma_o$, $f'_o$, $\alpha_S$, $\beta_S$) are introduced. In operation, the microprocessor calculates the value of the number $N_2$ from the value of the number $N_1$ applied to its input. It will be appreciated that the circuit 19 could also control the capacitance of a variable capacitor for directly adjusting the frequency f of the signal supplied by the oscillator 4, 6.

Figure 4A:
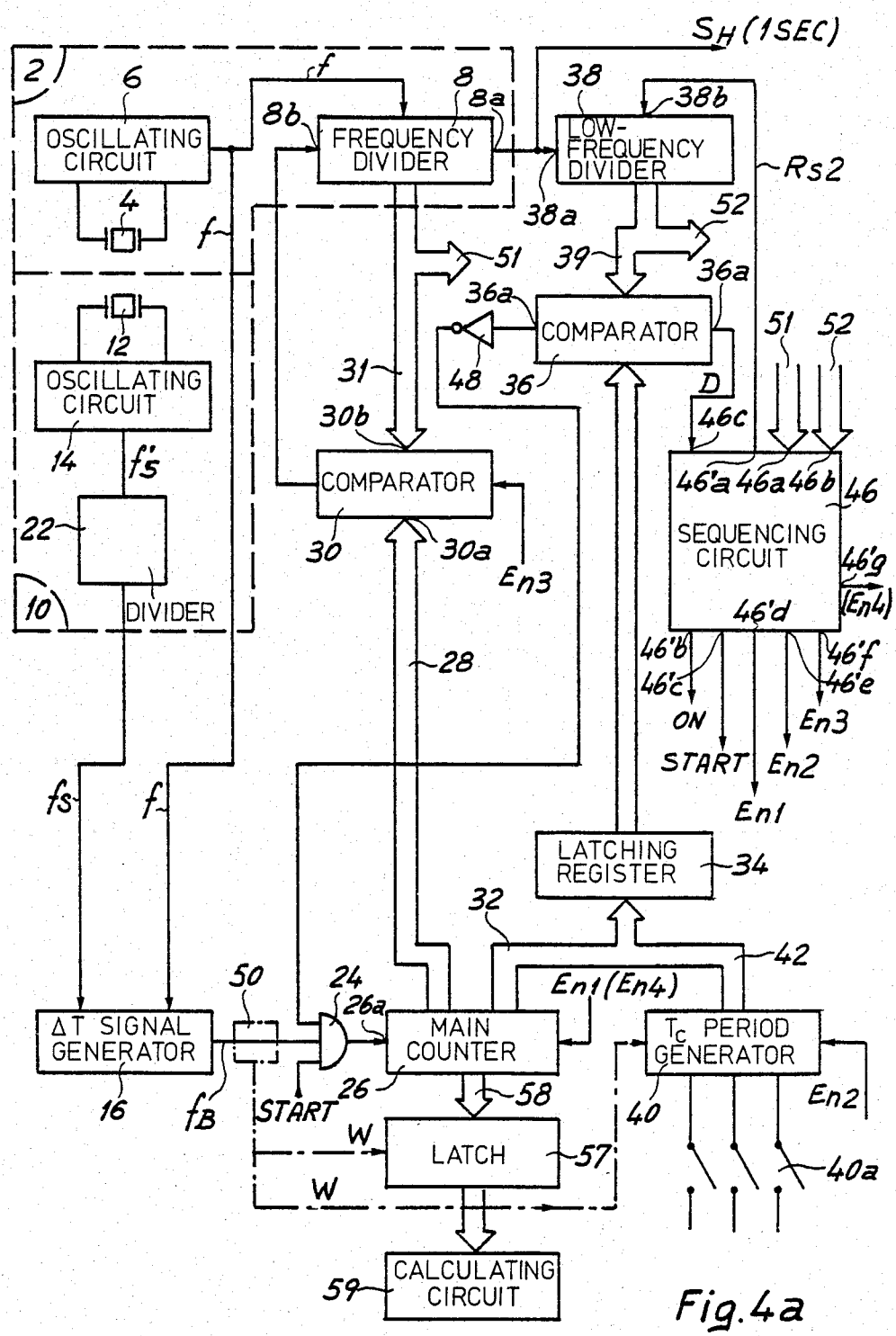
FIG. 4a is a more detailed circuit diagram of a first embodiment of the invention wherein correction is effected by acting on the divider stages, and the resonator produces a frequency with a quadratic dependency on temperature.

FIG. 4a shows in greater detail a preferred embodiment of the time base, in the prticular situation where the resonator 4 has a quadratic relationship as between the relative variation in frequency and the variation in temperature. The frequency f can then be written as follows:

$$f(T) = f_o(1 + \beta_o T^2).$$

For example, $$\beta_o = -34.10^{-9\circ} C.^{-2}.$$

FIG. 4a again shows the frequency generator 2 with its resonator 4, its oscillating circuit 6 and its divider 8 which produces at its output 8a the time signal $S_H$ which is a one second period signal. The oscillator 10 comprises the resonator 12 which is identical to that shown in FIG. 2 and the oscillating circuit 14 which is also identical to that shown in FIG. 2, producing a signal at a frequency f's. The oscillator 10 further comprises a divider 22 for dividing by 8 the signal at a frequency f's supplied by the resonator, to give the signal at frequency $f_S$ in FIG. 2. It will be recalled that the normal frequency of the signal produced by the resonator 12 is eight times that of the signal supplied by the resonator 4 ($f'_o = 8 f_o$). It will be seen therefore that the frequency of the signal supplied by the resonator is not critical. It is only necessary to choose the division factor of the divider 22 in order to produce equal frequencies $f_S$ and f. This means that, at the inversion temperature, the frequencies f and $f_S$ are equal. The two signals $f_S$ and f are introduced into the beat generator 16 which at its output produces the beat signal at a frequency $f_B$. The signal $f_B$ is introduced at one of the inputs of an AND gate 24 having its output connected to a clock input 26a of a main counter 26. The state outputs of the main counter 26 are connected by the bus 28 to a first series of comparison inputs 30a of a first comparator 30. The second series of inputs 30b of the comparator 30 is connected to the state outputs of the divider 8 by the bus 31. The state outputs of the main counter are also applied by way of a bus 32 to the inputs of a latching register 34. The outputs of the latch 34 are applied to a first series of inputs of a second comparator 36. In addition, the time signal $S_H$ of a period of one second, produced by the output 8a of the divider of the watch 8, is applied to the clock input 38a of a low-frequency divider 38. The state outputs of the divider 38 are applied by way of a bus 39 to the second series of inputs of the comparator 36. The time base further comprises a circuit 40 for producing a period $T_c$, which is programmable by the means diagrammatically indicated by the change-over switches 40a. The condition of the circuit 40 can be applied to the first series of inputs of the latch 34 by way of the bus 42. Finally, the time base comprises a control or sequencing circuit 46 which, at its inputs 46a and 46b, receives the signals at the state outputs of the dividers 8 and 38 by way of the buses 51 and 52.

At an input 46c, it also receives a signal D which is supplied by the coincidence output 36a of the comparator 36. At its output 46'a, it produces a signal RS2 which is applied to the resetting input 38b of the divider 38. The outputs 46'b to 46'f thereof respectively produce the signals ON, START, $E_{n1}$, $E_{n2}$ and $E_{n3}$.

The mode of operation of the circuit shown in FIG. 4a will now be described with reference to FIGS. 4a and 4b. If a time preceding the time t0 corresponding to the beginning of initialisation of an operating cycle is envisaged, only the oscillator 4, 6, the divider 8 and the divider 38 are operating. Moreover, the value of the period $T_c$ is contained in the presettable latch 34. When the comparator 36 detects a condition of equality as between the content of the divider 38 and the content of the memory 34, it emits a signal D to the control circuit 46 and the gate 24, by way of an inverter 48. That signal D has no effect since no other signal is applied to the gate. Moreover, the other main circuits, namely the oscillator 10, the beat generator 16, the comparator 30, the main counter 26 and the circuit 40 for producing the period $T_c$ are inoperative. At the moment that the signal D appears, the sequencing circuit 46 applies the resetting signal RS2 to the divider 38 and applies the signal 'ON' to the initially inoperative circuits, to activate them. When the control circuit 46 detects that the number of time pulses counted by the divider 38 is equal to the predetermined starting period $T_d$, it applies the signal 'START' to the AND gate 24 and the signal RS2 to the divider 38 which is thus reset to zero. In addition, the comparison output 36a which also produces the signal D is applied to one of the inputs of the AND gate 24, by way of an inverter 48. As, at that moment, the two groups of inputs of the comparator 36 are at different values, the signal D is at logic level 0. Therefore, at the output of the inverter 48, there is a logic signal at level 1. The gate 24 is therefore open. The beat signal $f_B$ which is supplied by the beat generator 16 is therefore applied to the clock input 26a of the main counter 26. When a predetermined period of time $T_1$ has elapsed since the beginning of the signal 'START', the control circuit 46 applies a pulse $E_{n1}$ to the counter 26. The effect of that is to transfer the present content of the counter 26 into the latch 34, by way of the bus 32. Let $N_1$ be the content of the counter 26. $N_1$ therefore represents the number of pulses of the signal of frequency $f_B$, during the time $T_1$, that is to say, it represents a parameter that is proportional to the temperature measured by the oscillator 10, with the oscillator 4, 6 being taken as the reference. The counter 26 continues to count the pulses of the signal $f_B$ and the comparator 36 compares the content of the memory 34, that is to say, $N_1$, to the content of the divider 38 which counts the periods of one second which are supplied by the divider 8. When the content of the divider 38 becomes equal to the content of the memory 34, the signal D goes to value 1 and the gate 24 is therefore closed. The counter 26 is therefore no longer incremented. The value of the content thereof is called $N_2$. It will be appreciated that the comparator produces the signal D when the divider 38 has counted a number of one second period pulses equal to the number of pulses $N_1$ contained in the memory 34. In consequence, at that moment, the content $N_2$ of the counter is equal to the entire number of pulses of the beat signal $f_B$ during the time duration equal to $T_1 \times N_1$ seconds. The number $N_2$ is therefore proportional to the square of the number of periods of the signal $f_B$ during the time $T_1$, that is to say, the square of the temperature difference. The condition outputs of the counter 26 are permanently connected to the inputs 30a of the comparator 30 by the bus 28. However, the comparator 30 is activated only when the signal $E_{n3}$ is applied thereto. In addition, the inputs 30a of the comparator cause complementation of the number which is aplied thereto, to the number 32768 which is the normal frequency of the signal produced by the oscillator 4, 6. If the general case of an oscillator 4, 6 producing a signal at a frequency F at the inversion temperature is considered, the divider 8 must therefore count N periods (N=1/F) to produce a period of one second at its output. In the above-described operation, the inputs 30a of the comparator therefore perform a step of complementation to N. The signal D is moreover applied to the input 46c of the control circuit 46. When that signal appears, the circuit 46 precisely emits the activation signal $E_{n3}$ which activates the comparator 30. The signal $E_{n3}$ is applied immediately at the beginning of a period of one second of the time signal. When the input 30b representing the content of the divider 8 is equal to the number applied to the input 30a of the comparator, the latter emits a signal RS1 which is applied to the resetting input 8b of the counter 8. As will be described hereinafter, the effect of that operation is to shorten the duration of that particular period of one second of the time signal by a duration of N2/32768 second. One second after the signal $E_{n3}$ appears, the signal 'ON' supplied by the control circuit 46 falls back to zero, the effect of which is to deactivate the oscillator 10, the beat generator 16 and the comparator 30. After one second, suppression of the number $N_2$ of periods of the time signal has been effected, that is to say, the correction operation has already been performed. When a period of time T3 has elapsed after the signal 'ON' has been reset, the control circuit 46 produces a signal $E_{n2}$, the effect of which is to transfer the content of the circuit 40 for producing the value of the period $T_c$, into the memory 34. That value is compared to the content of the counter 38. When the comparator 36 detects a condition of equality between the signals applied to its two groups of inputs, a signal D is emitted to the control circuit. The situation is then the same as at time $t_o$ and a fresh correction period commences. It will be readily understood that the total correction period $T_T$ is $T_c + T_d$, $T_d$ being the start-up time of the correction circuit.

Figure 4C:
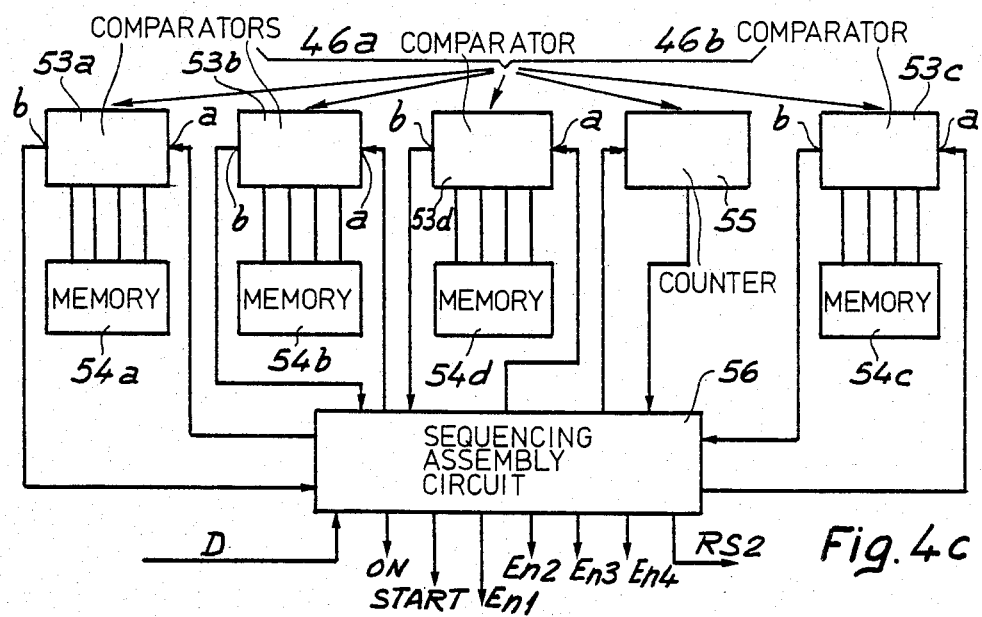
Figure 4B:
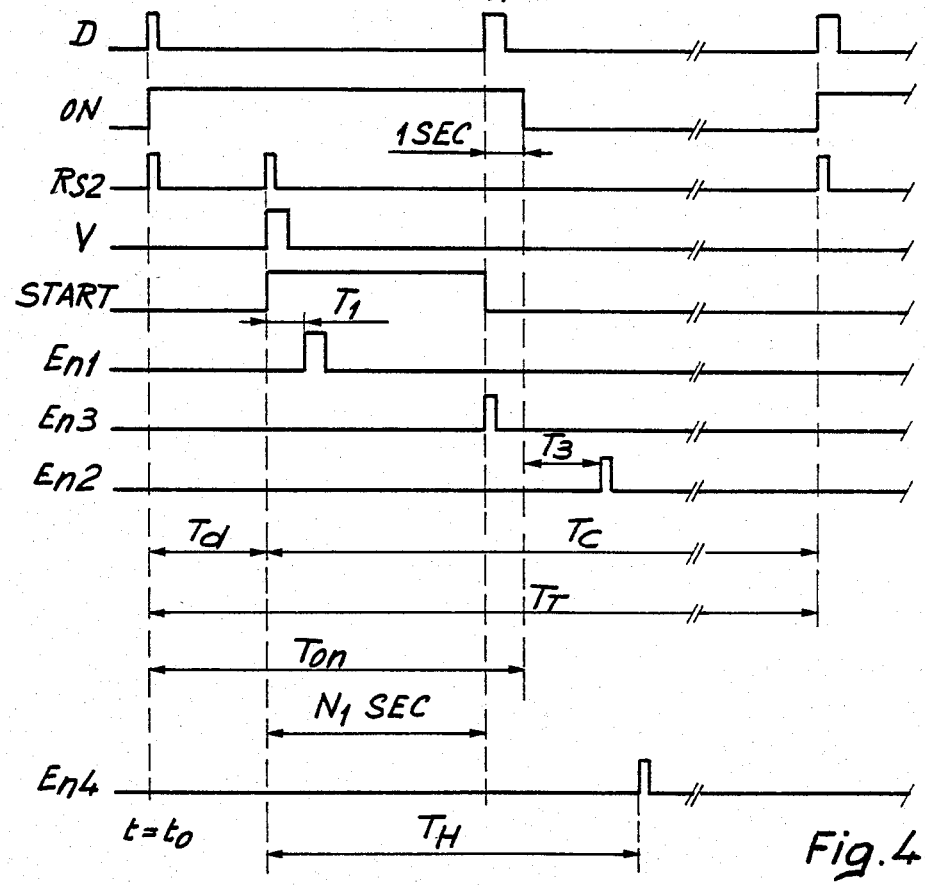

Refering now to FIG. 4c there is shown the control circuit 46 in somewhat greater detail. The purpose of the circuit 46 is to produce the signals provided at its outputs, under the effect of the signal D, by suitably introducing time delays. The control circuit receives at its inputs 46a and 46b, the binary states of the binary outputs of the counters 8 and 38. It is therefore possible to count durations of from 1/32768 second to 2047 second (if the counter 38 comprises 11 binary divisions stages for counting $T_c$). Those binary values are applied to a first series of inputs of comparators 53a, 53b and 53c. The circuit also comprises memories 54a, 54b and 54c which may be pre-loaded to the values $T_1$, $T_d$ and $T_3$. They are respectively connected to the second group of inputs of the comparators 53a, 53b and 53c. Each comparator further comprises a coincidence output a and an activation input b. The control circuit further comprises a counter 55 for producing the interval of one second in response to the activation signal applied to its input b. The activation signals are emitted by a sequencing assembly 56 which receives the signal D and the coincidence signals supplied by the comparators.

The circuit 56 produces the signals applied at the outputs 46'a to 46'f of the circuit 46. The precise structure of the sequencing circuit will be apparent from the foregoing description and the time diagrams. There is therefore no need to describe it in greater detail.

When the timing quartz 4 has a quasi-quadratic relationship, it will be seen that the circuits for associating the number $N_2$ with the number $N_1$ are very simple since they only use conventional integrated circuits.

If reference is made again to the simplified circuit shown in FIG. 2, it is easy to establish the correspondence between the detailed embodiment shown in FIG. 4a and the simplified embodiment shown in FIG. 2. The circuit 16 in FIG. 2, for producing the number $N_1$, clearly comprises the gate 24, the main counter 26 and the latch 34. As regards the adjusting circuit 18 in FIG. 2, it comprises means for producing $N_2$ from $N_1$, means for detecting and producing the end of the period $T_c$ and, on the other hand, means for subtracting the $N_2$ pulses. The first means comprise the counters 26 and 38, the memory 34 and the comparator 36. The second means comprise the circuit 40, the memory 34, the comparator circuit 36 and the divider circuit 38. The third means essentially comprise the comparator 30 and the watch divider 8. It will be clearly seen from this that some of the components of the circuit perform a double function, which is the case in particular with the counter 26 which serves for counting both the numbers $N_1$ and $N_2$, the latch 34 which successively stores the number $N_1$ and the period $T_c$, the comparator 36 which successively compares the content of the counter 38 to the number $N_1$ and the number corresponding to the period $T_c$, and the counter 38 which serves to produce the time $N_1$ seconds and to detect the end of the period $T_c$.

In addition, it is important clearly to understand the fashion in which the correction operation is performed, on the basis of production of the number $N_2$. The correction operation comprises subtracting the number of pulses $N_2$ from the pulses supplied by the oscillator 4, 6, which are required for producing a period of one second of the time signal $S_H$, more particularly for a single period of one second every correction period, that is to say, at moments which are separated by the period of time $T_T = T_c + T_d$.

The manner of defining the period $T_c$ will now be explained.

It is assumed first of all that the function fo(T) is constant, that is to say, in the temperature range under condideration (for example, 0° C. to 50° C.), the variations in fo are negligible in comparison with the variations in the frequency $f_S(T)$ of the signal produced by the thermal sensor 10. The relationships are then as follows:

$$f(T) = f_o (f_o = 32,768 \text{ Hz})$$

and $$f_S(T) = 8 \times f_o(1 + \alpha_S T);$$

$\alpha_S$ being constant for a given resonator, and T representing the temperature difference between the inversion temperature Ti of the resonator 4 and ambient temperature $T_a$.

The beat frequency, taking the divider 22 into account, is given by the following expression;

$$f_B(T) = f_S/8 - f$$
$$= f_o(1 + \alpha_S T) - f_o = \alpha_S f_o T$$

$N_1$ is the number of full periods contained in the signal $f_B$ during the period of time $T_1$. Therefore: $N_1 = Int\{T_1/\alpha_S f_o T/\}$, $Int\{F\}$ representing the integer part of the numerical value of the function F.

To obtain $N_2$, the full periods of $f_B$ during the time $N_1$ seconds are counted, giving:

$$N_2 = Int\{N_1 T_1 \alpha_S f_o T\}$$

$$N_2 = Int\{T_1 \cdot Int\{T_1 \alpha_S f_o T\} \cdot \alpha_S f_o T\}$$

We again set $T_T = T_d + T_c$; $T_T$ representing the precise period to which the adjustment is made.

So that the mean operating error of the time base over the period $T_T$ is zero, the relationships must be as follows:

$$f_o T_T = f T_T + N_2$$
$$f_o T_T = T_T f_o(1 + \beta_o T^2) + N_2$$

$$T_T = \frac{N_2}{f_o \beta_o T^2}$$

The precise value of $N_2$ is $\alpha^2_S f_o^2 T^2 T_1^2$ hence $$T_T = -\frac{\alpha_S^2 f_o^2 T^2 T_1^2}{f_o \beta_o T^2} = -\frac{\alpha_S^2}{\beta_o} f_o T_1^2$$

that is to say, in that approximation, $T_T$ is independent of the temperature T.

If $T_1$ is one second, and taking the numerical values of $\alpha_S$, $\beta_o$ and f already given above: $T_T \cong 1114$ seconds.

It is then easy to deduce $T_c$ therefrom. For example, for the circuit being considered, the period $T_d$ is 4 seconds.

If reference is made to the circuit shown in FIG. 4a, it will be seen that the components 40a permit pre-programming of the value of $T_c$ at the value corresponding to the quartz resonators which are actually used ($\alpha_S$, $\beta_o$, f).

The same calculations will now be repeated, but taking into consideration the fact that the frequency f of the quartz 4 is of the form $f = f_o(1 + \beta_o T^2)$, and that the frequency $f'_S$ of the sensor 12 is of the form $f'_S = 8 \times f_o(1 + \alpha_S T + \beta_S T^2)$.

The period $T_T$ is given by the following relationship:

$$T_T = -n^2 f_o \frac{[\alpha_S + (\beta_S - \beta_o)T]^2}{\beta_o(1 + \beta_o T^2)^2}$$

in which formula n is defined as follows:

$$T_1 = -n^2 f_o \frac{\alpha_S + (\beta_S - \beta_o)T^2}{\beta_o(1 + \beta T^2)^2}$$

The expression $\beta_o T^2$ being negligible compared with 1 in the temperature range in question, $T_T$ may be written as follows:

$$T_T = -n^2 f_o \frac{[\alpha_S + (\beta_S - \beta_o)T]^2}{\beta_o}$$

That expression depends on the temperature T. If the numerical values already indicated above are adopted and if $T_1$ is one second (whence n=1), the value of $T_T$ in dependence on ambient temperature $T_a$ are given by the following table:

| $T_a$ °C. | $T_T$ (sec) | |
|---|---|---|
| 0 | 1027 | |
| 10 | 1062 | |
| 20 | 1096 | |
| 25 | 1114 | $T_i = 25°$ C. |
| 30 | 1132 | |
| 40 | 1168 | |
| 50 | 1204 | |

In order to take strict account of that dependency of $T_T$, and therefore $T_c$, on ambient temperature, it would be possible to design the circuit 40 as a microprocessor having those values stored in its memory. The microprocessor would be controlled by the value $N_1$ representing the temperature difference between ambient temperature and the inversion temperature. As that difference may be positive or negative, the circuit would also comprise a detector 50 for detecting the sign of the beat frequency $f_B$. It is this which is illustrated in dash-dotted lines in FIG. 4a.

However, such an arrangement complicates the circuit. It has been found that a very good approximation to that law in respect of variation is achieved by adopting only two values for $T_T$. Namely, a value $T_T-$ when the ambient temperature is lower than the inversion temperature; and a value $T_{T+}$ in the opposite situation.

For the numerical values already considered:

$T_{T-} = 1059$ seconds, and $T_{T+} = 1169$ seconds.

With those values, the maximum mean error introduced is of the order of 0.25 ppm for the ambient temperature range of from 0° C. to 50° C.

In the embodiment corresponding to that approximation, the circuit shown in FIG. 4a comprises the sign detector 50 which produces the signal W in accordance with the sign of the beat frequency. The circuit 40 makes it possible to produce two values of $T_c$, corresponding respectively to $T_{T-}$ and $T_{T+}$. At each correction, it is the signal W which determines which of those two values is to be stored in the circuit 34, when the signal $E_{n2}$ appears.

Figure 5A:
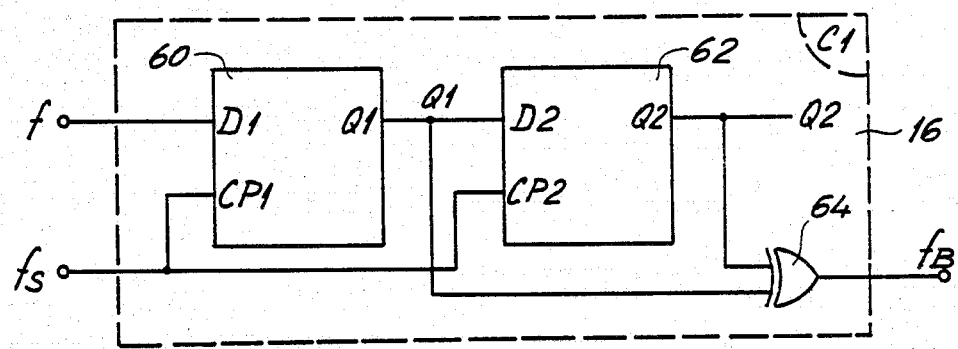
FIG. 5a is a detailed circuit diagram of an embodiment of the beat generator.

FIGS. 5a and 5b illustrate an embodiment of the beat generator. It comprises a first D-type flip-flop 60 with a clock input $CP_1$ and control input $D_1$. The input $D_1$ receives the signal at a frequency fo and the input $CP_1$ receives the signal at a frequency $f_S$. The circuit 16 comprises a second D-type flip-flop 62 whose control input $D_2$ is connected to the output $Q_1$ of the flip-flop 60, and whose clock input $CP_2$ receives the signal at a frequency $f_S$. Finally, the outputs $Q_1$ and $Q_2$ of the flip-flops are connected to the inputs of an exclusive OR gate 64. The output of the gate 64 produces the beat signal $f_B$ which is of a value 2 (fo-$f_S$). The time diagrams shown in FIG. 5b illustrate the form of the various signals.

Figure 6A:
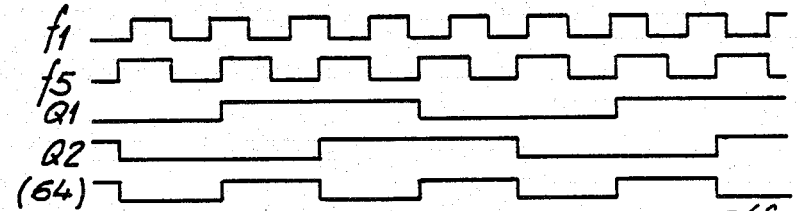
FIG. 6a is a circuit diagram of part of the arrangement, showing in greater detail the manner in which the $N_2$ pulses representing the square of the variation in temperature can be produced.
Figure 6A:
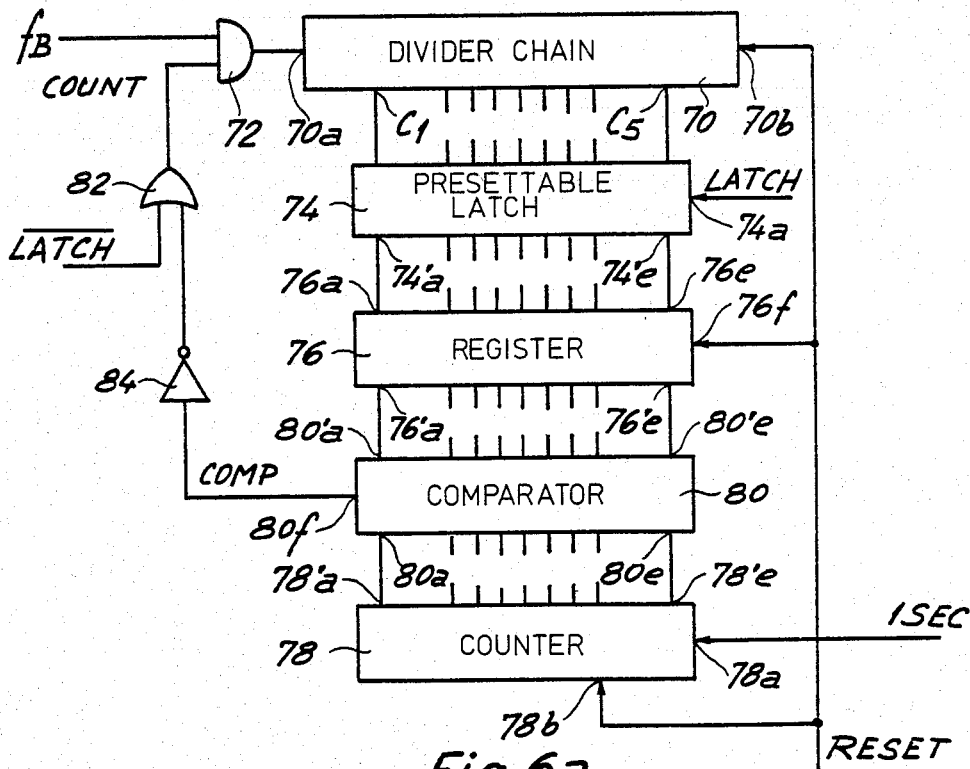
Figure 6B:
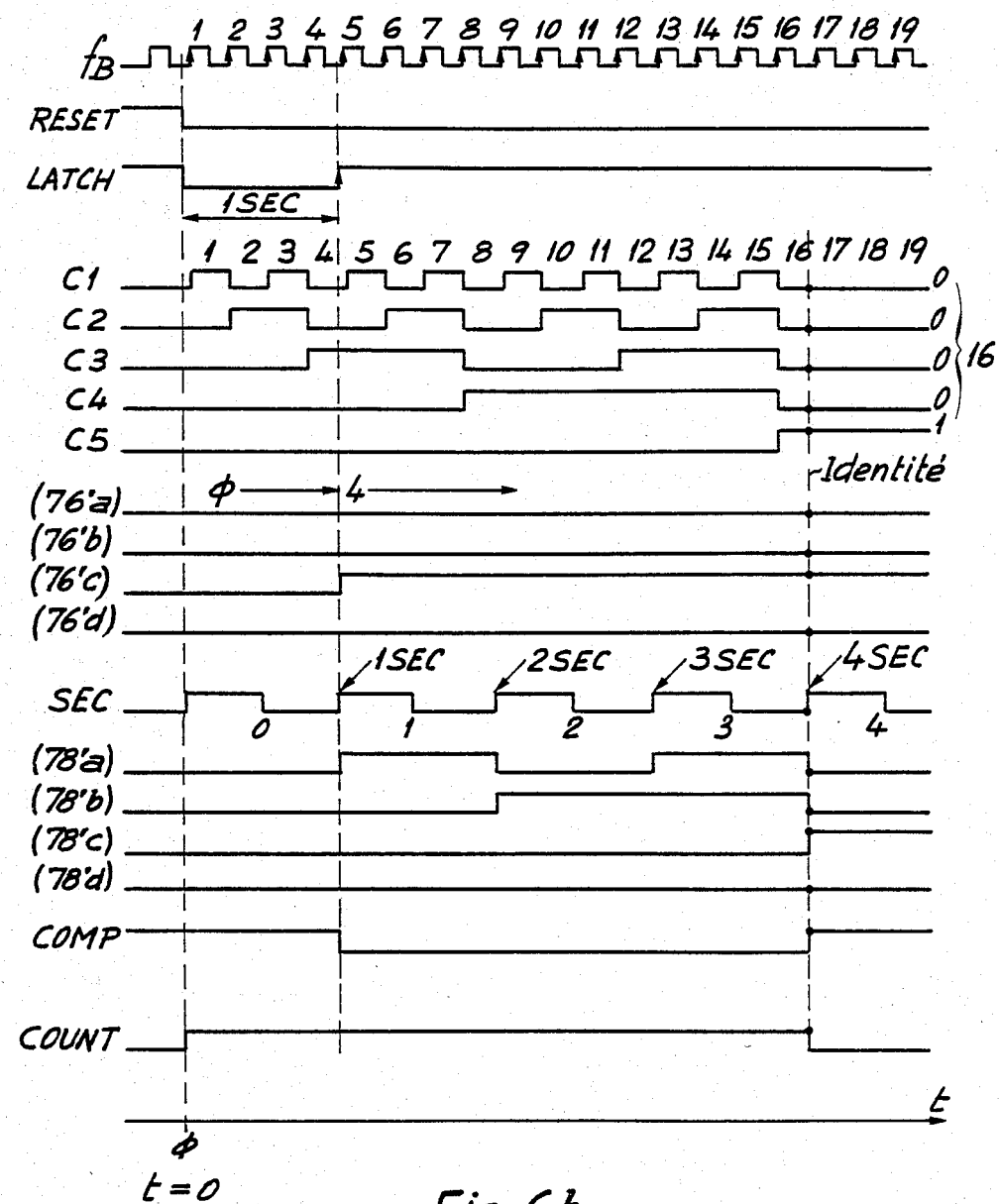

FIGS. 6a and 6b illustrate in greater detail an alternative embodiment of the circuit for producing the number $N_2$ which is proportional to the square of the temperature, when $T_1$ is one second.

The illustrated circuit comprises the divider chain 70 corresponding to the counter 26, of which the drawing shows the binary state outputs $C_1$ to $C_5$ which are associated with the lower binary weights and the resetting input 70b. The clock input 70a of the divider chain receives the beat signal of frequency $f_B$ by way of the AND gate 72. It also comprises a presettable latch 74, the inputs of which are connected to the outputs $C_1$ to $C_5$ of the divider chain 70. It further comprises the register 76 whose inputs 76a to 76e are connected to the outputs 74'a to 74'e of the latch 74 and which further comprises the resetting input 76f and the outputs 76'a to 76'e.

FIG. 6a also shows the counter 78 corresponding to the counter 38. The counter 78 comprises a clock input 78a, a resetting input 78b and a state outputs 78'a to 78'e. The drawing also shows a comparator 80 comprising a first series of inputs 80a to 80e connected to the outputs 78'e, to 78'e of the counter 78, and a second series of inputs 80'a to 80'e connected to the outputs 76'a to 76'e of the register 76. The comparator produces at its output 80f a signal COMP at logic level 1, when the signals applied to its two series of inputs are identical. Finally, the circuit includes an OR gate 82 which receives the signal COMP at one of its inuts, by way of an inverter 84, and, at its other input, the signal LATCH which will be explained below. The output of the gate 82 produces a signal COUNT which is applied to the second input of the gate 72.

The resetting input 78b, 76f and 70b receive the binary signal RESET. The input 78a of the counter 78 receives a time signal SEC of a period of one second, and the control input 74a receives the signal LATCH. The diagrams in FIG. 6b illustrate the mode of operation of the circuit when $T_1$ is one second.

At time t=o, the signal RESET resets the counter 78, the register 76 and the counter 70. With the signal LATCH being at logic level 0, the signal COUNT at the output of the gate 82 is at logic level 1. The gate 72 is therefore in a conducting condition and the counter 70 is incremented by the pulses of the signal at frequency $f_B$. The rising edge of the signal LATCH which appears one second after time t=o, since $T_1$ is one second, loads the present content of the counter 70, that is to say, the number $N_1$, into the register 76. That number represents the number of periods of the beat signal in one second. The counter 78 counts the seconds from time t=o. When the comparator detects a condition of equality between the state of the register 76 and the content of the counter 78, the signal COMP assumes logic level 1. The two signals COMP and LATCH are therefore at logic level 0, as also is the signal COUNT. The gate 72 is closed and the counter 70 ceases to be incremented. The counter content $N_2$ is then $f_B N_1$, that is to say, a number substantially proportional to the square of the number of periods of the signal at frequency $f_B$ during the period of time $T_1$ since, in a period of time of one second, the signal at frequency $f_B$ may comprise $N_1$ periods plus a fraction of a period. As has already been explained, it is the number $N_2$ which is proportional to the square of the temperature difference, that serves to perform the correction operation every period $T_T$. In the example shown in FIG. 6, $N_1$ is 4 and $N_2$ is 16 since $T_1$ is one second.

Figure 7A:
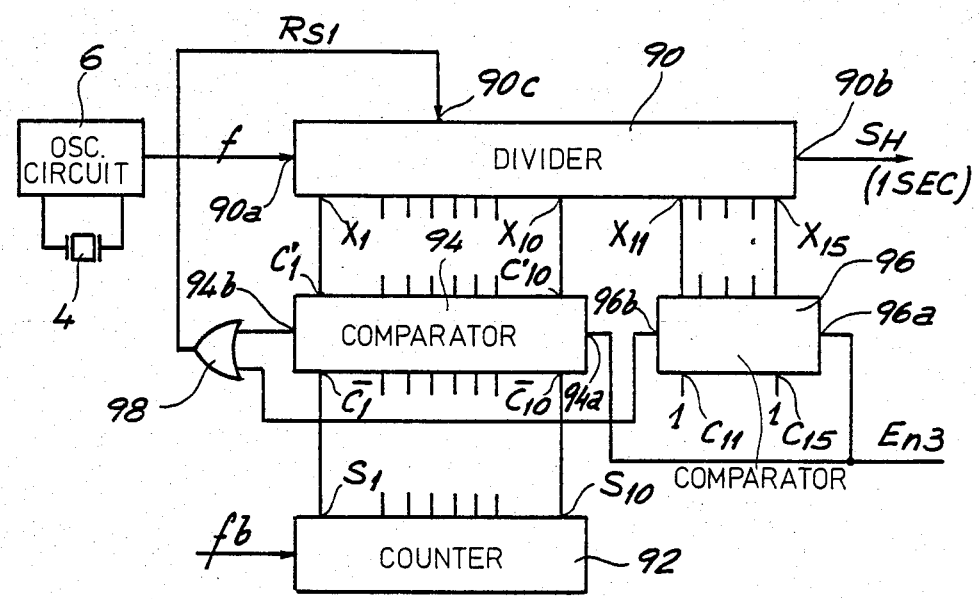
FIGS. 7a to 7c show a first method of adjusting the frequency produced by the first oscillator.
Figure 7B:
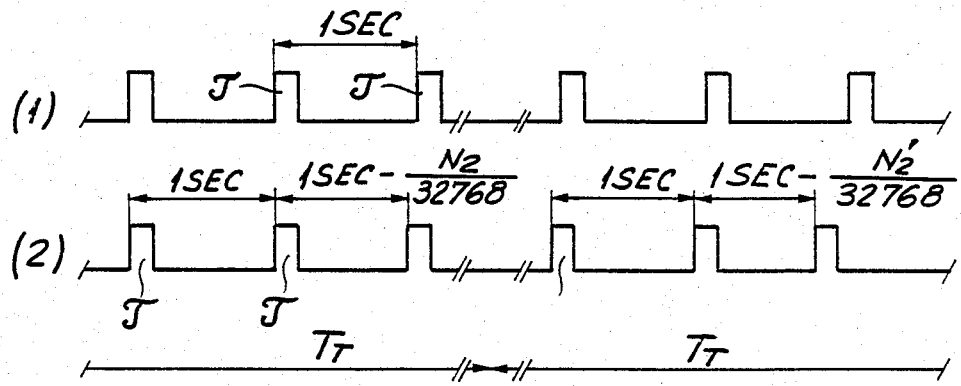

FIGS. 7a and 7b illustrate in greater detail the first mode of adjustment as already described above with reference to FIG. 4a. The circuit comprises a divider 90 which is identical to the divider 8 in FIG. 4a. At its clock input 90a, the divider 90 receives the signal at a frequency f, which is supplied by the resonator 4, 6. The output 90a of the divider produces the time signal $S_H$, the normal period of which is one second in this case. In the particular case being considered, the divider 90 produces a short pulse J at the end of each period, as shown in FIG. 7b.

The divider also comprises state outputs $X_1$ to $X_{15}$ which thus continuously give the state of the divider, in the binary form. The divider further comprises a resetting input 90c. The divider comprises fifteen binary division stages for counting the 32768 pulses corresponding to a normal second. The circuit also includes a counter 92 which is identical to the counter 26 and which serves inter alia to produce the number $N_2$. The counter 92 has ten division stages and therefore ten counting outputs, referenced $S_1$ to $S_{10}$. That number of stages is sufficient. In fact, the number $N_2$ cannot exceed 1000.

The circuit further comprises a comparison assembly which is equivalent to the comparator 30 in FIG. 4a. The comparison assembly is formed by comparators 94 and 96. The comparator 94 comprises on the one hand inverting inputs $\overline{C}_1$ to $\overline{C}_{10}$ connected to the counting outputs $S_1$ to $S_{10}$ of the counter 92 and non-inverting inputs $C'_1$ to $C'_{10}$ connected to the counting outputs $X_1$ to $X_{10}$ of the divider 90. The comparator 94 further comprises an activation input 94a and a comparison output 94b. The comparator 96 comprises five inputs $C_{11}$ to $C_{15}$ all preset to "1" and five inputs connected to the outputs $X_{11}$ to $X_{15}$ of the divider 90, those inputs being of highest binary weights. The comparator 96 further comprises an activation input 96a and a comparison output 96b. As in the case shown in FIG. 4a, the activation inputs 96a and 94a receive the signal $E_{n3}$. In addition, the comparison outputs 94b and 96b are connected to the inputs of an AND gate 98 which produces a signal RS1 applied to the resetting input 90c of the divider 90.

The state of the outputs $S_1$ to $S_{10}$ of the counter 92 gives the value of the number $N_2$, in binary form. The complement of $N_2$ to $2^{10}$ therefore occurs at the inverting inputs $\overline{C}_1$ to $\overline{C}_{10}$ of the comparator 94. In addition, the inputs $C_{11}$ to $C_{15}$ of the comparator 96 are all at 1. Therefore, the comparison assembly 94, 96 has the complement of $N_2$ to $2^{15}$ (32,768) at its first group of inputs. In fact, with $N_2$ being less than 1000, the five highest binary weights are zero if $N_2$ is written in binary form. If the complement of $N_2$ for $2^{15}$ is taken, the five highest binary weights of that complement are therefore 1.

The content of the divider 90 is continuously applied to the inputs $C'_1$ to $C'_{15}$ of the comparison assembly 94, 96. Thus, if a condition of equality is detected when the signal $E_{n3}$ goes to level 1 at their inputs 94a and 96a, the AND gate 98 produces a signal RS1 at logic level 1, which resets the divider 90 and a time pulse J is produced by the output 90b of the divider. The pulse J is emitted when the divider has counted $32768 - N_2$ pulses of the signal at a frequency fo, instead of the 32768 pulses, for a normal second. It will be seen therefore that the corresponding 'second' has been shortened by $N_2/32768$ second. That is to say, the adjustment has actually been made.

If consideration is given to the general situation in which the oscillator 4, 6 is of a frequency F and the divider 90 is to count N pulses to produce a period of 1 second, it will be easily seen that the adjusted period is shortened by (N2/N) second.

FIG. 7b shows the unadjusted time signal $S_H$ (1) and the adjusted signal $S_H$ (diagram 2) of the value $N_2$ during an adjustment period $T_T$ and the value $N'_2$ during the following period $T_T$, corresponding to a variation in the temperature difference between the two adjustment periods.

Figure 7C:
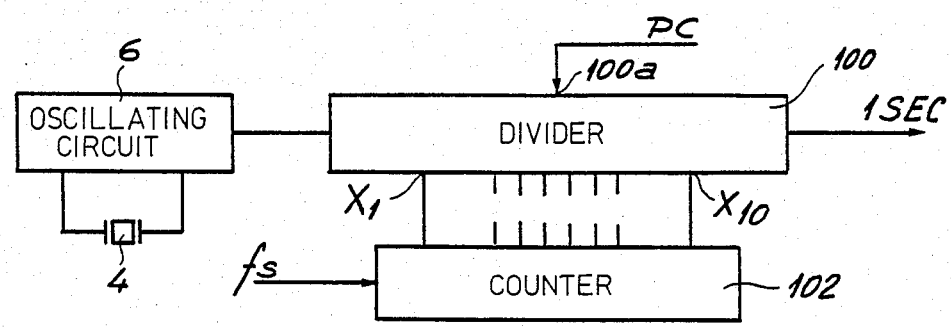

FIG. 7c illustrates an alternative embodiment of the part of the circuit for adjusting the frequency, on the basis of the number $N_2$ that is proportional to the square of the temperature difference. The adjustment comprises shortening the length of the period of time which elapses between two pulses which are normally separated by an interval of one second, by pre-loading the time counter to the value $N_2$. Thus, the real time between the two pulses is shortened by $N_2/32768$ second.

For that purpose, the circuit comprises a divider 100 with a capacity of $2^{15}$, with pre-loading inputs $X_1$ to $X_{10}$, and a pre-loading control input 100a. It will be appreciated that it performs the same function as the divider 8 in FIG. 2.

The clock input of the divider is connected to the output of the oscillator 4, 6. A counter 102 having ten binary counting stages, which is identical to the counter 26 in FIG. 4a, has its output $S_1$ to $S_{10}$ connected to the inputs $X_1$ to $X_{10}$ of the divider 100. When the correction is to be applied, a short pre-loading pulse PC is applied to the input 100a of the divider between application of the 32768 th pulse and application of the 32769 th pulse which initializes the fresh period of 'one second'. It will be readily appreciated that the duration of that period of 'one second' is shortened by $N_2/32768$ second.

Referring again to FIG. 3, it will be seen that in principle the characteristic II of the thermal sensor must pass through the inversion point $I_1$ of the characteristic I of the resonator 4. It has already been explained that that condition is not critical. However, if that optimum situation does not occur, there is a simple way, in accordance with the invention, of shifting the characteristic II parallel to the axis of the ordinates, and adjusting it to pass through the point $I_1$. The shift may be effected by modifying the number of pulses of the signal at a frequency fo, which is to be counted by the divider 8, 90 or 100. Let M be the number of pulses per second. Therefore, during the period of time $T_T$, it will be necessary to modify the number of pulses of the value $M \times T_T = M'$, to have the proper characteristic, on average, over a period $T_T$. It is only necessary to modify $N_2$ by M' when the temperature compensation effect is produced.

Other advantages of the invention will be clearly apparent from the foregoing description. The operating time of the comparison circuit is proportional to the difference between the inversion temperature and ambient temperature. Under normal conditions of use of the watch, the operating time is therefore very limited. In addition, the cycle ratio in respect of operation of the temperature measuring and correction assembly is very low, being between 0.5% and 3.2%.

It should also be noted that the thermal sensor is not associated with any frequency divider and that, of the circuits added to those of a normal watch time base, only the beat generator is supplied with signals at high frequency. All processing of the information to produce $N_2$ is carried out at low frequency, below 30 Hz. The level of power consumption is therefore limited. Finally, as has already been emphasised, a high number of components operate sequentially to perform a plurality of functions. The surface area of the integrated circuit can therefore be reduced.

Figure 8:
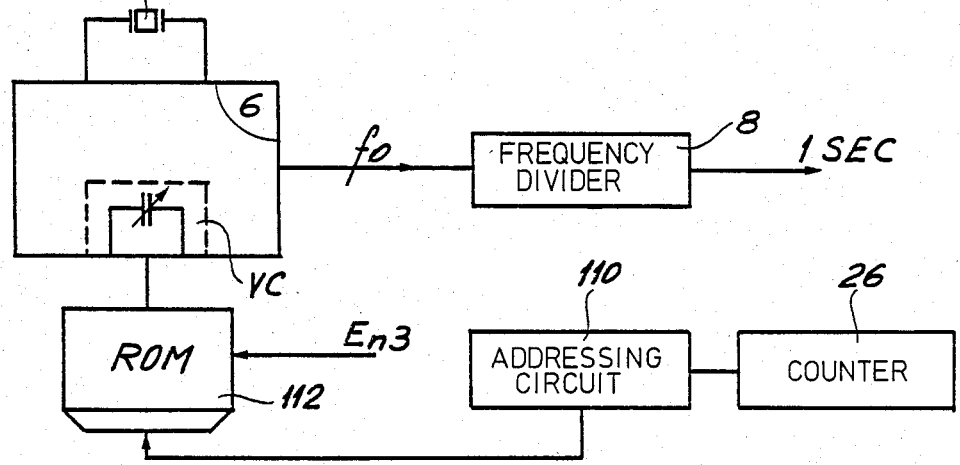
FIG. 8 is a circuit diagram showing a second embodiment of the circuit for adjusting the frequency produced by the first oscillator.

FIG. 8 shows in simplified form, a second method of adjusting the frequency in dependence on the temperature difference. This embodiment involves acting directly on the oscillating circuit 6. The circuit 6 comprises a variable capacitance capacitor VC for adjusting the frequency fo supplied by the oscillator 4, 6. The number $N_2$ calculated by the counter 26 as described above with reference to FIG. 4a is applied to the input of an addressing circuit 110. A ROM 112 contains, for each address, a capacitance value that the capacitor VC may assume. For each value of $N_2$ therefore, the ROM produces a capacitance value corresponding to the correction to be applied to the frequency supplied by the oscillator in dependence on the temperature difference. As in the above-described embodiment, the adjusting action is performed only after the activation signal $E_{n3}$ is applied to the ROM. That value is maintained until the following signal $E_{n3}$ is applied.

It should be appreciated that, in this embodiment, it is the frequency fo of the resonator 4 which is directly corrected. In the other embodiments, the frequency fo is not modified, and it is the mean period of the signal $S_H$ which is corrected.

The foregoing description corresponds to the case where $\beta o$ is negative. In that case, the adjusted 'second' is shorter than the normal second. It will be appreciated that, when $\beta o$ is positive, the adjusted 'second' must be increased in length, in comparison with the normal second. In other words, $N_2$ pulses must be added to the pulses which are normally counted, to produce an adjusted period of 'one second'. The corresponding modification in the circuits is within the capability of the man skilled in the art. Consequently the wording "modified period" means either that the period is shortened ($\beta$ negative) or that the period is lengthened ($\beta o$ positive).

It will be seen that the number $N_1$ provides a parameter which is representative of the temperature or more accurately the difference between the ambient temperature $T_a$ and the inversion temperature $T_i$. When the time base is used in a time keeping device such as a watch, it is an attractive proposition to make use of that value $N_1$ in order to display temperature, in addition to time.

The value of $N_1$ is given by the following expression:

$$N_1 = Int[T_1 \alpha_s f_o T].$$

If $N_1$ is very much greater than 1, the equation can be written as follows:

$$N_1 \cong (T_1 \alpha_s f_o) \cdot T.$$

In order for $N_1$ actually to give temperature, it is sufficient to $T_1 \cdot \alpha_s f$ to be an integral power of 10.

If for example the degree of resolution selected is 1/10th of a degree, the following equation must apply: $T_1 \alpha_s f_o = 10$.

If the above-mentioned values in respect of $\alpha_s$ and f are used, that will require a value of $T_1$, which will be referred to as $T_H$, of 8.97 seconds. $N'_1$ will be used denote the number of periods of the beat signal which are counted during the period of time $T_H$.

FIGS. 4a and 4c show certain additional components which actually make it possible to produce the number $N'_1$ which gives temperature. The control circuit 46 also includes the comparator 53b which is similar to the comparators 53a to 53c, and a memory 54d which is similar to the memories 54a and 54c and which is preloaded to the selected value $T_H$. At the time at which the sequencing circuit 56 produces the second pulse of the signal RS2, that is to say, at the end of the period Td, an activation signal is applied to the comparator 53d. The comparator 53d compares the binary number applied by the buses 51 and 52 to its first series of inputs, to the binary number which is preprogrammed in the memory 54d. When there is a condition of coincidence, that is to say, when the period of time $T_H$ has elapsed, the circuit 56 produces a signal $E_{n4}$ which appears at the output 46'g of the control circuit 46 and which causes the present content of the counter 26 to be transferred into a latch 57, by way of the bus 58. The signal $E_{n4}$ is shown in FIG. 4b. The latch then contains the number $N'_1$, that is, to say, thenumber of tenths of degrees difference between the inversion temperature and the ambient temperature, in binary form. In addition, the signal W supplied by the circuit 50 gives the sign of that difference. The difference merely has to be added to or taken from the inversion temperature, for example 25° C., by means of a calculating circuit 59, to produce a number $N'''_1$ which gives the ambient temperature to within a tenth of a degree, in binary form.

Figure 9:
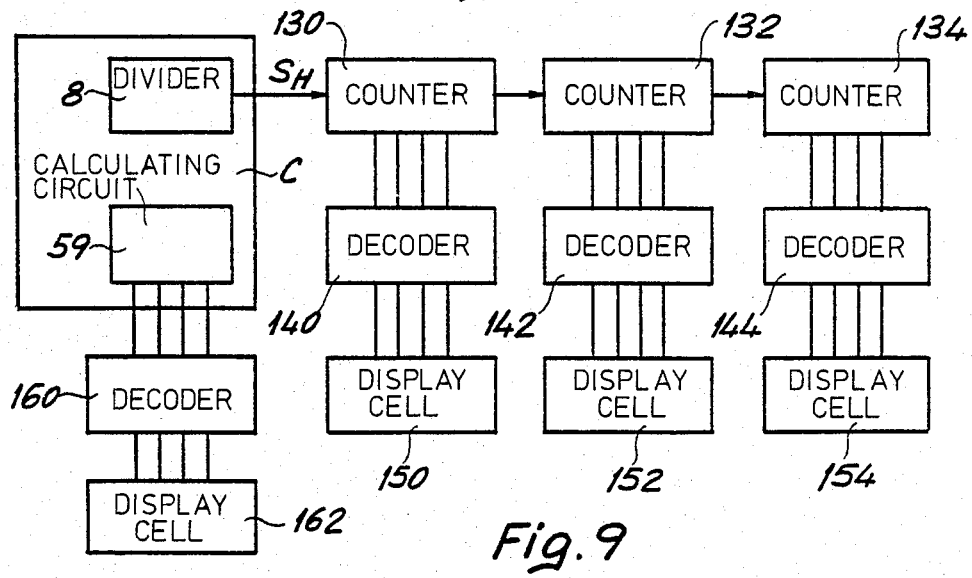
FIG. 9 is a simplified circuit diagram of a watch provided with the time base shown in FIG. 4a, which also provides for display of temperature.

FIG. 9 shows in simplified form a watch of digital display type, provided with the above-described time base which also permits the measured temperature to be displayed. C is used to refer to the time base which only shows the divider 8 for producing the signal $S_H$ with a period of one second, and the calculating circuit 59 which gives the value of the ambient temperature in binary form. The signal $S_H$ is applied to the input of a seconds counter 130 which is a divider with a division factor of 60. The output of the counter 130 is connected to the clock input of a minutes counter 132, which is a divider having a division factor of 60. Finally, the output of the counter 132 is connected to the clock input of an hours counter 134 which is a divider with a division factor of 12. Each counter is associated with a decoder 140, 142, 144 which controls a respective display cell 150, 152 and 154, for example of liquid crystal type.

The output of the calculating circuit 59 is connected to a decoder 160 for controlling a display cell 162. The display cell thus displays the temperature, to within a tenth of a degree, in decimal form.

It will be appreciated that the watch could be of analog type with hands. The pulses $S_H$ serve to control the motor for driving the hands. There are a number of possible ways of displaying temperature, on the basis of the number $N''_1$. The watch may comprise a display cell, in addition to the hands. That is then similar to the situation described above. Alternatively, the watch may comprise a second motor for driving an additional hand which moves in relation to a scale representing temperatures. The motor is controlled by a number of pulses proportional to $N''_1$. Alternatively, the time display given by means of the hands is periodically interrupted, in which case the motor receives a number of pulses that is proportional to $N''_1$ to move the minutes hand for example in relation to a scale representing temperature. In the last-mentioned case, it is necessary to provide time pulse counters, drive pulse counters and comparators, in order not to lose the time information during the temperature display phases and to resume the time information display after each temperature display phase.

Various other modifications of the present invention will be apparent to those skilled in the art, and it therefore is intended that the scope of the present invention be limited solely by the scope of the appended claims.

What is claimed is:

1. A time base provided with thermal compensation, comprising:
    a first frequency generator including a first oscillator provided with a piezoelectric resonator and producing a first signal at a first frequency which is dependent on temperature wherein said first resonator has a relationship between the relative variation in frequency ($\Delta f/f$) and the variation in temperature T with respect to its inversion temperature of the form $(\Delta f/f) = \alpha_O T + \beta_O T^2 + \gamma_O T^3 + \ldots$, wherein $\alpha_O$, $\beta_O$ and $\gamma_O$ are constant coefficients;
    a second frequency generator including a second oscillator provided with a piezoelectric resonator and producing a second signal at a second frequency which is substantially linearly dependent on temperature in a range for which thermal compensation is desired, wherein said second resonator has a substantially linear relationship between the relative variation in frequency ($\Delta f/f$) and the variation in temperature T with respect to the inversion temperature of the first resonator, of the form: $(\Delta f/f) = \alpha_s T + \beta_s T^2$, $\alpha_s$ and $\beta_s$ being coefficients such that $\alpha_s$ is at least one hundred times greater than $\beta_s$, wherein $\beta_s$ is of the same order of magnitude as $\beta_o$;
    means for producing a signal which is representative of temperature, in response to the signals produced by said oscillators;

means for producing a correction signal in response to said temperature signal, and means for adjusting the frequency of the signal produced by said first frequency generator in response to said correction signal.

2. A time base according to claim 1 wherein said means for producing the temperature signal comprise:
   means for producing a periodic beat signal between said first and second signals produced by the oscillators; and
   means for counting the periods of said beat signal for a predetermined period of time $T_1$.

3. A time base according to claim 2 wherein the terms $\alpha_0 T$ and $\gamma_0 T^3$ are negligible with respect to the term $\beta_0 T^2$.

4. A time base according to claim 3 wherein said means for producing the temperature signal comprises means for producing a periodic beat signal between the signals supplied by said first and second resonators; means for counting the periods of said beat signal; and means for memorizing the number $N_1$ of periods counted during a period of time $T_1$, and said means for producing the correction signal comprise means for memorizing the number of periods $N_2$ of the beat signal during a period of time $N_1$ seconds, said number $N_2$ being representative of the square of the number of periods of the beat signal during the time $T_1$.

5. A time base according to claim 4 wherein said first frequency generator further comprises a frequency divider for producing at least one time signal of a period of 1 second in response to counting of a given number N of periods of the signal which is supplied by said first resonator, and wherein said adjustment means comprise said frequency divider, means for producing a control signal of a period $T_T$ which is greater than $N_1$ seconds, and means for modifying periodically, with the period $T_T$, by $N_2$ pulses, the N pulses which are normally counted by said divider to produce a period of one second, said adjusted period being modified by (N2/N) second.

6. A time base according to claim 5 wherein said means for producing the control signal of period $T_T$ comprise means for memorizing two numerical values of the period, $T_{T+}$ and $T_{T-}$ respectively, means for detecting the sign of said beat signal, and means for giving to the period $T_T$, one of said two values in response to the sign detection signal.

* * * * *